United States Patent
Chen et al.

(10) Patent No.: US 8,789,008 B2
(45) Date of Patent: Jul. 22, 2014

(54) METHODS FOR GENERATING DEVICE LAYOUTS BY COMBINING AN AUTOMATED DEVICE LAYOUT GENERATOR WITH A SCRIPT

(75) Inventors: Chih-Hung Chen, Hsinchu (TW); Wen-Hao Yu, Hsinchu (TW); Shyh-An Tang, Taichung (TW)

(73) Assignees: Synopsys Taiwan Co., Ltd., Chupei, Hsinchu Hsien (TW); Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/189,014

(22) Filed: Jul. 22, 2011

(65) Prior Publication Data

US 2012/0066659 A1 Mar. 15, 2012

Related U.S. Application Data

(60) Provisional application No. 61/382,302, filed on Sep. 13, 2010.

(51) Int. Cl.
*G06F 17/50* (2006.01)

(52) U.S. Cl.
CPC .................................. *G06F 17/5068* (2013.01)
USPC ........... 716/139; 716/119; 716/122; 716/123; 716/132

(58) Field of Classification Search
USPC .......................... 716/119, 122–123, 132, 139
See application file for complete search history.

(56) References Cited

U.S. PATENT DOCUMENTS

| | | | | |
|---|---|---|---|---|
| 6,077,308 | A * | 6/2000 | Carter et al. | 716/103 |
| 6,321,367 | B1 * | 11/2001 | Chun et al. | 716/55 |
| 6,457,163 | B1 | 9/2002 | Yang | |
| 6,804,809 | B1 * | 10/2004 | West et al. | 716/119 |
| 7,178,114 | B2 | 2/2007 | Lin et al. | |
| 7,257,794 | B2 * | 8/2007 | Tang et al. | 716/122 |
| 7,496,862 | B2 * | 2/2009 | Chang et al. | 716/119 |
| 7,546,232 | B2 * | 6/2009 | Brooks et al. | 702/183 |
| 8,046,730 | B1 * | 10/2011 | Ferguson et al. | 716/139 |
| 8,225,256 | B2 * | 7/2012 | Potemski et al. | 716/110 |
| 2004/0225986 | A1 * | 11/2004 | Lin et al. | 716/10 |
| 2007/0124327 | A1 * | 5/2007 | Park | 707/102 |
| 2008/0244475 | A1 * | 10/2008 | Lo et al. | 716/4 |
| 2010/0017762 | A1 * | 1/2010 | Monkowski et al. | 716/4 |
| 2010/0235801 | A1 * | 9/2010 | Potemski et al. | 716/11 |
| 2011/0061034 | A1 * | 3/2011 | Ginetti et al. | 716/104 |

* cited by examiner

*Primary Examiner* — Naum Levin
(74) *Attorney, Agent, or Firm* — Kilpatrick Townsend & Stockton LLP

(57) ABSTRACT

Methods for generating a device layout are provided. First, design rules corresponding to a specific technology are received. A selection of at least one element and a parameter value corresponding to at least one parameter on the selected element are received. A draft device layout corresponding to the selected element is generated by a device generator by referencing the parameter value and the design rules. A script is then executed to modify the draft device layout to generate an updated device layout. The script includes at least one command, and when the script is executed, the at least one command is performed to modify the parameter value of the at least one parameter of the selected element and cause the device generator to delete the old draft device layout and generate a new draft device layout by referencing the modified parameter value and the design rules.

15 Claims, 8 Drawing Sheets

METHODS FOR GENERATING DEVICE LAYOUTS BY COMBINING AN AUTOMATED DEVICE LAYOUT GENERATOR WITH A SCRIPT

CROSS REFERENCE TO RELATED APPLICATIONS

This application claims the benefit of U.S. Provisional Application No. 61/382,302 filed Sep. 13, 2010, the entirety of which is incorporated by reference herein.

BACKGROUND OF THE INVENTION

1. Field of the Invention

The disclosure relates generally to methods for generating design layouts of integrated circuits (ICs), and more particularly to methods for automatically generating draft device layouts and allowing execution of scripts for modifying the draft device layouts, including re-generation of draft layouts based on modified parameter values.

2. Description of the Related Art

A typical IC includes a semiconductor substrate doped in a desired pattern and several layers of insulating and conductive materials sequentially formed above the substrate. The doping patterns in the substrate and the layer patterns define structures of IC devices such as gates, transistors and passive devices (inductors, capacitors and resistors), along with the conductive networks that interconnect the IC devices.

For custom layout designs, designers typically use parameterized cells (PCells) as building blocks. Traditionally, PCells are defined in scripting languages, of which some are proprietary, such as the Cadence SKILL language, and some are in the public domain, such as TCL or Python. To instantiate a script-based PCell in a layout, the designer needs to specify the PCell name and give a list of values for the parameters. The system then realizes the layout for the PCell instance by executing the corresponding script with the parameter values provided by the designer.

Although script-based PCells provide a flexible way for generating device layouts, the programming effort for the scripts is huge, and the subsequent maintenance of the scripts is difficult and complicated. Alternatively, a built-in device generator can be provided for reducing the effort needed for the scripts. U.S. Pat. No. 6,457,163 entitled "Method and system for constructing and manipulating a physical integrated circuit layout of a multiple-gate semiconductor devices" discloses an example of built-in device generator. For built-in device generators, a predefined set of elements can be programmed in the layout tool in advance, and the designer can select specific elements, wherein the corresponding layouts can be automatically generated by the built-in device generator. It is noted that the designer only needs to prepare and maintain design rules for the built-in device generator in layout tools. The built-in device generator is easy to use by the designer since no scripting or template designing is needed. Unfortunately, the predefined elements in the built-in device generator are limited to specific layout patterns. For new design rules/layout patterns which are not currently supported in a built-in device generator, the designer can do nothing but to wait since the device generator is provided by the tool vendor, and is purely a black box to the designer. This limitation can be alleviated if the built-in device generation is augmented with the power and flexibility of scripting as found in script-based PCells. U.S. Pat. No. 7,178,114 entitled "Scripted, hierarchical template-based IC physical layout system" discloses a method of embedding a script in a template-based IC layout generator. However, the script is tailored to the template-based generation approach. It does not offer a full-blown scripting capability such as querying and editing. Moreover, it lacks the capability of modifying parameter values and requesting for a re-generation.

What is needed is a device layout generation method that can automatically generate device layouts for ICs while allowing designers to provide scripts which can modify the device layouts including modifying parameter values and requesting for a re-generation, thus enabling the device generator to be easily extended or modified, and offer ease of use with great flexibility for layout design.

BRIEF SUMMARY OF THE INVENTION

Methods for generating device layouts by combining an automated device layout generator with a script are provided.

In an embodiment of a method for generating device layouts, a parameter value corresponding to at least one parameter on at least one element is received. A draft device layout corresponding to the selected element is generated by a device generator by referencing at least the parameter value. Then, a script is executed to modify the parameter value, and cause the device generator to generate an updated device layout by referencing at least the modified parameter value.

In an embodiment of a method for generating device layouts, design rules corresponding to a specific technology are received. A selection of at least one element and a parameter value corresponding to at least one parameter on the selected element are received. A draft device layout corresponding to the selected element is generated by a device generator by referencing the parameter value and the design rules. A script is then executed to modify the draft device layout to generate an updated device layout. The script includes at least one command, and when the script is executed, the at least one command is performed to modify the parameter value of the at least one parameter of the selected element and cause the device generator to delete the old draft device layout and generate a new draft device by referencing the modified parameter value and the design rules.

In some embodiments, a setting corresponding to the script can be received, and the device generator executes the script by referencing the setting. In some embodiments, the setting is in a technology file comprising the design rules corresponding to the specific technology. In some embodiments, the setting is outside the technology file.

In some embodiments, the script may contain querying or editing commands. When the script is executed, the commands are performed to query layer information, connectivity information, or design rule information of the draft device layout, query parameter values of the draft device layout, delete at least one object in the draft device layout, create and add at least one object to the draft device layout, or modify a shape of the at least one object in the draft device layout.

In some embodiments, the script may contain commands that modify parameter values and ask the device generator to re-generate a new draft device layout based on the modified parameter values to replace the old draft device layout.

Methods for generating device layouts may take the form of a program code embodied in a tangible media. When the program code is loaded into and interpreted or executed by a machine, the machine becomes an apparatus for practicing the disclosed method.

BRIEF DESCRIPTION OF THE DRAWINGS

The invention will become fully understood by referring to the following detailed description with reference to the accompanying drawings, wherein.

DETAILED DESCRIPTION OF THE INVENTION

Methods for generating device layouts are provided.

Figure 1:
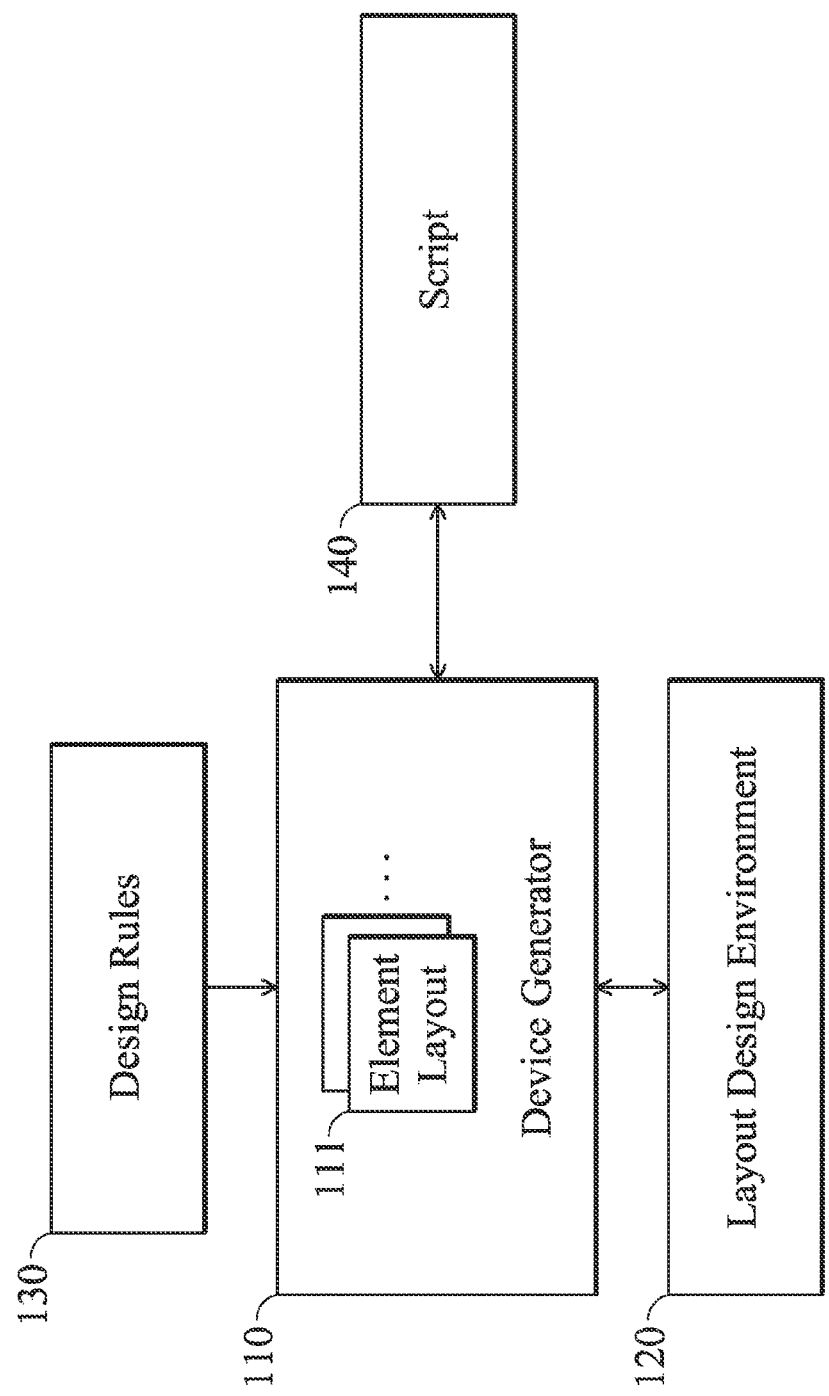
FIG. 1 is a schematic diagram illustrating an embodiment of the architecture of device layout generation of the invention.

FIG. 1 is a schematic diagram illustrating an embodiment of the architecture of device layout generation of the invention. According to the architecture, a device generator 110 can be executed in a layout design environment 120. The device generator 110 can generate device layouts 111 corresponding to a plurality of elements, such as transistor devices, register devices, etc. The device generator 110 provides the elements to users for selection, and automatically generates the device layouts 111 corresponding to the selected elements. It is understood that, in some embodiments, users can pass parameter values corresponding to related parameters of the selected element to the device generator 110 via the layout design environment 120. In some embodiments, the parameter may comprise a channel width or a channel length of a MOS device. The device generator 110 generates the device layouts 111 according to the parameter values. It is noted that the device generator 110 generates the device layouts 111 by referencing design rules 130 corresponding to a specific technology. The design rules 130 define related specifications and rules for the specific technology. In some embodiments, the parameter and the corresponding parameter value are validated according to the design rules corresponding to the specific technology.

According to the architecture, a script 140 can be associated with a device element to help generate the final device layout for that device element. It is understood that the script 140 may be codes in some scripting languages provided by users. In some embodiments, the device generator 110 can first generate a draft device layout, and the script 140 can modify the draft device layout. It is noted that, in order to enable the layout design environment 120 to execute the script 140 after a draft device layout is generated, a setting of the script 140 must be first defined. The layout design environment will execute the script by referencing the setting. In some embodiments, the setting of the script 140 can be defined in a technology file. For example, the pseudo code of an original technology is shown bellow:

```
device {
    deviceName { pmos }
    .... # Define the technology (layers and related rules) for the device
}
```

A script can be defined in the technology file as follows:

```
device {
    deviceName { pmos }
    callBack {
        ... # Define script here
    }
    .... # Define the technology (layers and related rules) for the device
}
```

Further, in some embodiments, the setting of the script can be defined outside the technology file. For example, an outside file to be sourced or an individual section defined in a library level technology file can be defined as follows:

```
device {
    deviceName { pmos }
    callBack {
        ... # Define scripts here
    }
}
```

It is understood that, the above manners for defining the script 140 are only examples of the present application. The setting of the script 140 can be defined in various manners, and the present invention is not limited thereto. Further, in addition to the setting of the script 140, users can define script parameters to be used by the script 140, and input related parameter values for the corresponding script parameters via an interface provided by the layout design environment 120. As described, the script 140 may reference script parameters. When the script 140 is executed, the draft device layout generated by the device generator 110 is modified according to the parameter values of the corresponding script parameters.

It is understood that, in some embodiments, the script may contain commands, and the commands are executed to perform related operations when the script is executed. In some embodiments, the commands can query device technology, such as layer information or design rule information of the draft device layout. In some embodiments, the commands can query the parameter values of the corresponding parameters for the draft device layout. It is noted that the parameters may be internal parameters which users cannot conventionally input/access from any interface of the layout design environment 120. In some embodiments, the commands can query layout data of the draft device layout. In some embodiments, the layout data may comprise connectivity data such as the logical data (net/port/pin) in the draft device layout; connectivity and shape data such as logical (net) information of a given shape created in the draft device layout, shape data such as shapes of a specific geometry in the draft device layout, layer data such as all the layers used by the draft device layout, shape and layer data such as all the shapes for a specific layer in the draft device layout. It is noted that the above layout data is only an example of the present application, and the present invention is not limited thereto. In some embodiments, the commands can delete at least one object in the draft device layout, create and add at least one object to the draft device layout, or modify a shape of the at least one object in the draft device layout. In some embodiments, the commands can modify parameter values obtained from the device generator 110 and request the device generator 110 to use the new parameter values to generate a new draft device layout to replace the old one. After that, the remaining commands in the script may continue to do some, or all, of the above example works on the newly generated draft device layout.

Figure 2:
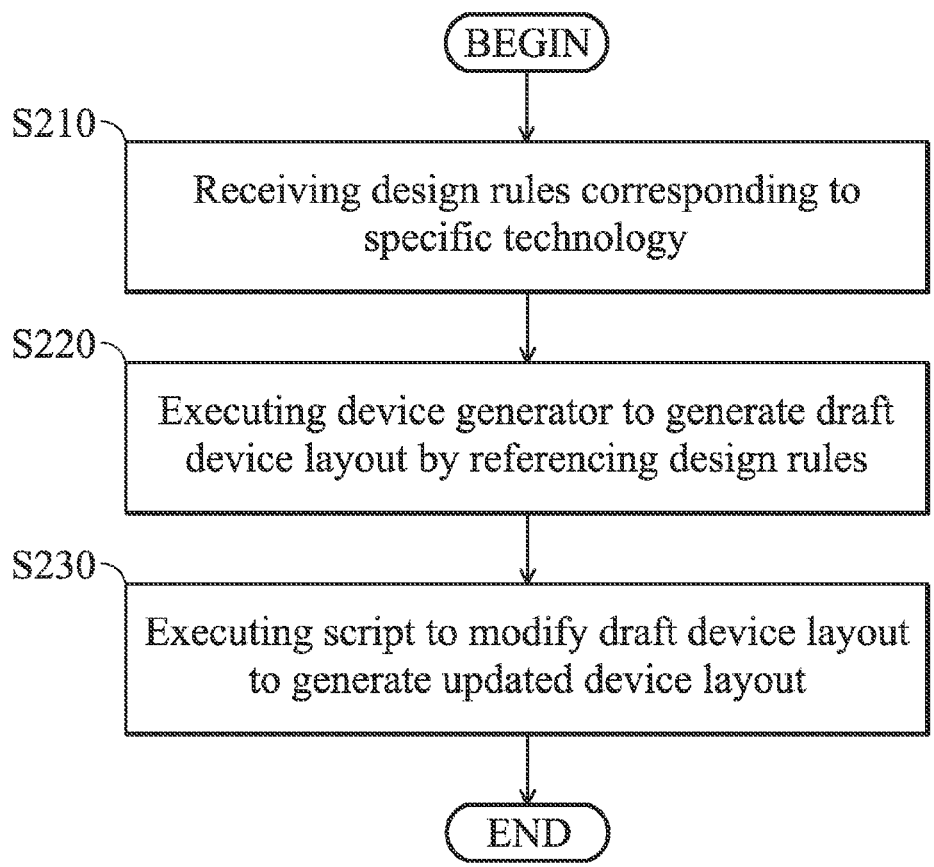
FIG. 2 is a flowchart of an embodiment of a method for generating device layouts according to the invention.

FIG. 2 is a flowchart of an embodiment of a method for generating device layouts according to the invention.

In step S210, design rules corresponding to a specific technology is received. The design rules define related specifications and rules for the specific technology. In step S220, a device generator is executed in a layout design environment to automatically generate a draft device layout by referencing the design rules. It is understood that, in some embodiments, the device generator can provide elements to users for selection, and automatically generate the element layouts corresponding to the selected elements. It is noted that, in some embodiments, parameter values corresponding to related parameters can be provided to the device generator, and the device generator generates the element layouts according to the parameter values. It is understood that, in some embodiments, before the parameter values are used to generate the draft device layout, the parameter and the corresponding parameter value can be validated according to the design rules. Then, in step S230, a script is executed to modify the draft device layout to generate an updated device layout. It is understood that, in some embodiments, at least one parameter value corresponding to the at least one script parameter can be received via an interface, and the draft device layout can be modified according to the script parameter value by executing the commands in the script. Similarly, when the script is executed, commands in the script can query the device technology, the parameter values, and/or the layout data of the draft device layout, delete at least one object in the draft device layout, create and add at least one object to the draft device layout and/or modify a shape of the at least one object in the draft device layout, modify the parameter value of the draft device layout, and/or cause the device generator to re-generate a draft device layout.

Figure 6:
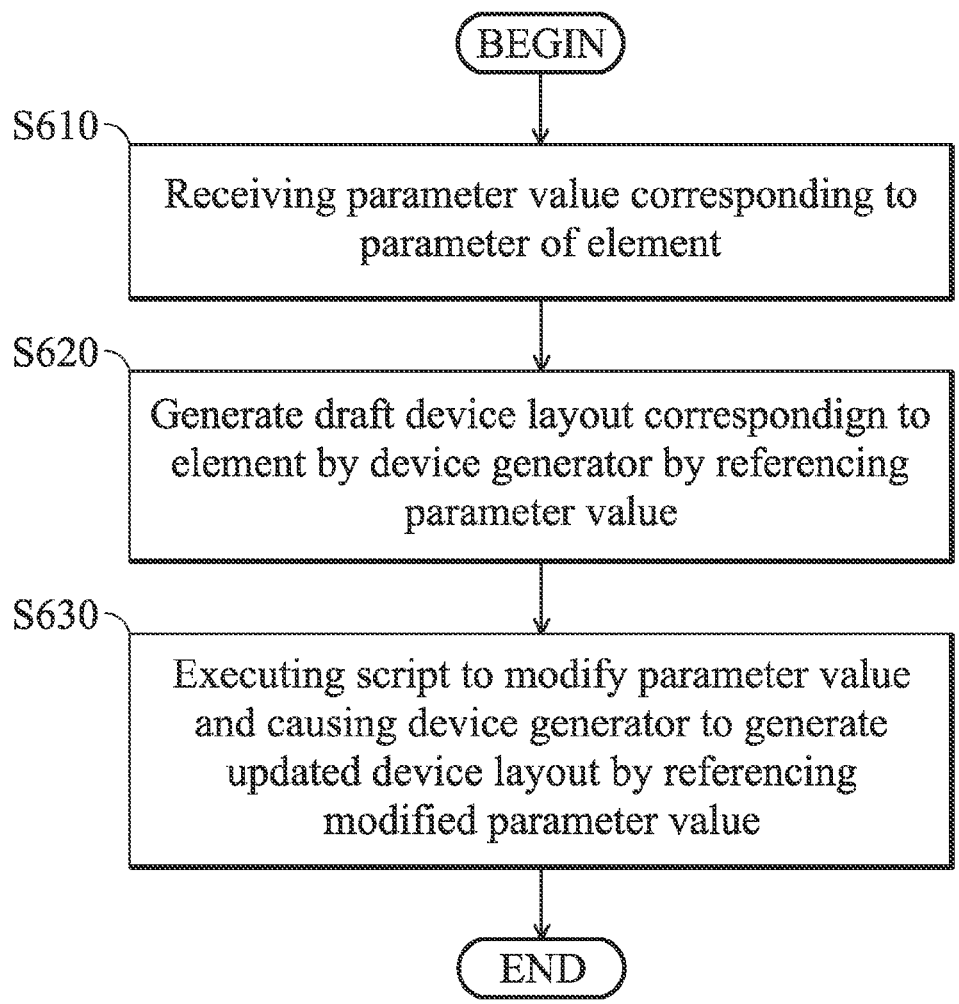
FIG. 6 is a flowchart of another embodiment of a method for generating device layouts according to the invention.

FIG. 6 is a flowchart of another embodiment of a method for generating device layouts according to the invention.

In step S610, a parameter value corresponding to at least one parameter for at least one element is received. In step S620, a draft device layout corresponding to the element is generated by referencing at least the parameter value by a device generator. It is understood that, in some embodiments, design rules corresponding to a specific technology can be also received, wherein the design rules define related specifications and rules for the specific technology. In some embodiments, the parameter and the corresponding parameter value can be validated according to the design rules, and the device generator can generate the draft device layout by referencing the parameter value and the design rules. After the draft device layout is generated, in step S630, a script is executed to modify the parameter value corresponding to the parameter of the element, and cause the device generator to generate an updated device layout by referencing at least the modified parameter value.

Figure 3:
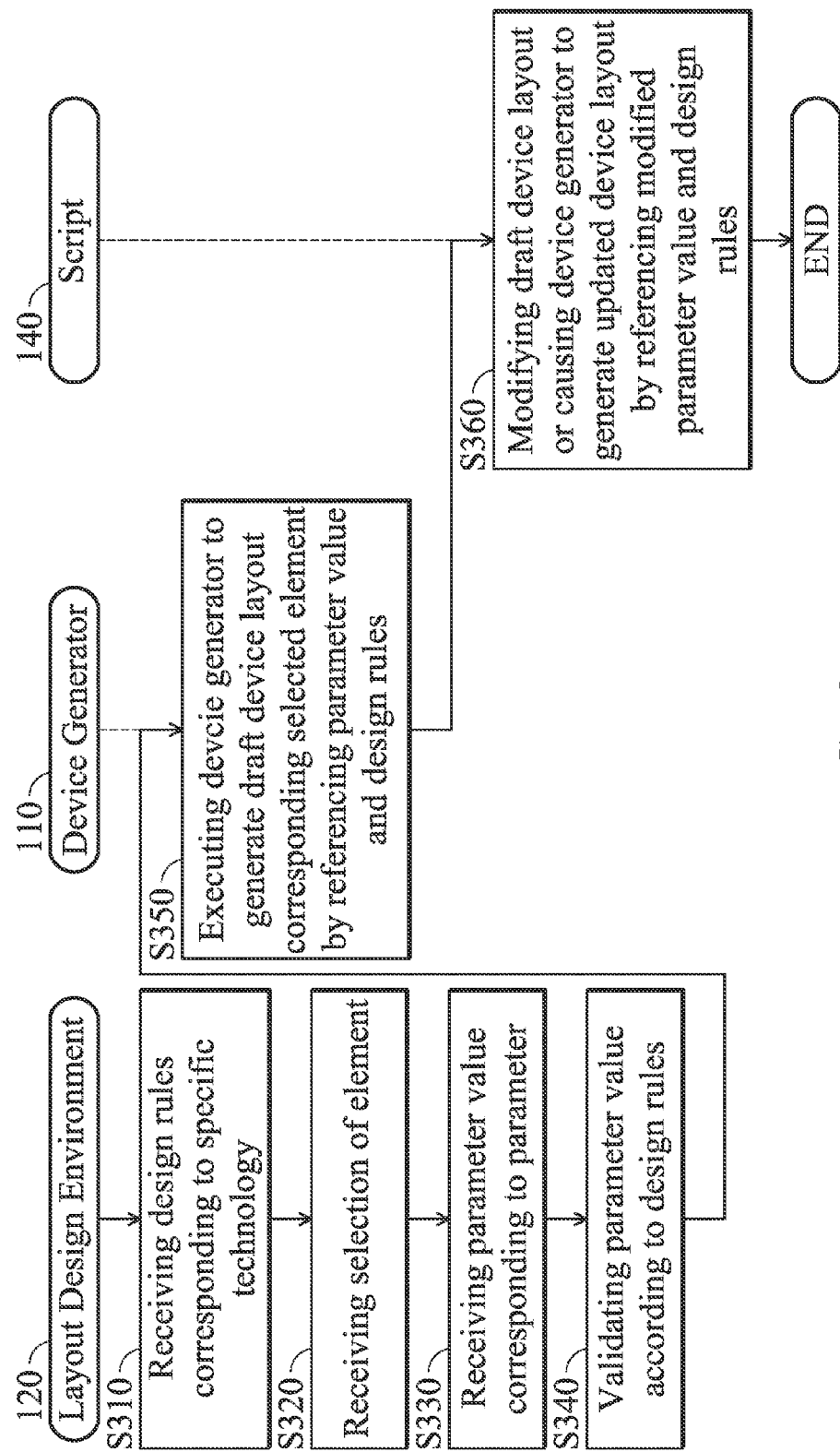
FIG. 3 is a flowchart of another embodiment of a method for generating device layouts according to the invention.

FIG. 3 is a flowchart of another embodiment of a method for generating device layouts according to the invention.

In step S310, design rules corresponding to a specific technology is received by the layout design environment 120. In step S320, a selection of at least one element is received. It is understood that, a plurality of elements can be provided to users for selection. In step S330, at least one parameter value corresponding to at least one parameter for the selected element is received via the layout design environment 120. After the at least one parameter value is received, in step S340, the at least one parameter and the corresponding parameter value are validated and corrected according to the design rules corresponding to the specific technology. In step S350, a device generator 110 is executed, and the at least one parameter value is passed to the device generator 110 from the layout design environment 120. The device generator 110 automatically generates a draft device layout corresponding to the selected element according to the at least one parameter value and by referencing the design rules. After the draft device layout is generated, in step 360, a script 140 is executed. It is understood that the script 140 can obtain the draft device layout generated by the device generator 110, and modify the draft device layout to generate an updated device layout. It is understood that, at least one parameter value corresponding to the at least one parameter for the script can be received via an interface in layout design environment 120, and the draft device layout may be modified by the script according to parameter value. It is noted that, in some embodiments, via the use of the script 140, users can either change the draft device layout directly, query the device generator for parameter values, update/modify the parameter values and then force the device generator 110 to re-generate a new draft device layout, or both. It is further noted that the script 140 may have added some shapes before asking the device generator 110 to re-generate the new draft device layout. In which case, device generator 110 will only remove the shapes that it previously generates, and leave those shapes added by the script in tact. After re-generation, script 140 can continue to work on the new draft device layout. This query, modify, edit and re-generate process can be repeated until satisfied. At end, the updated device layout is passed to the layout design environment 120.

Figure 4A:
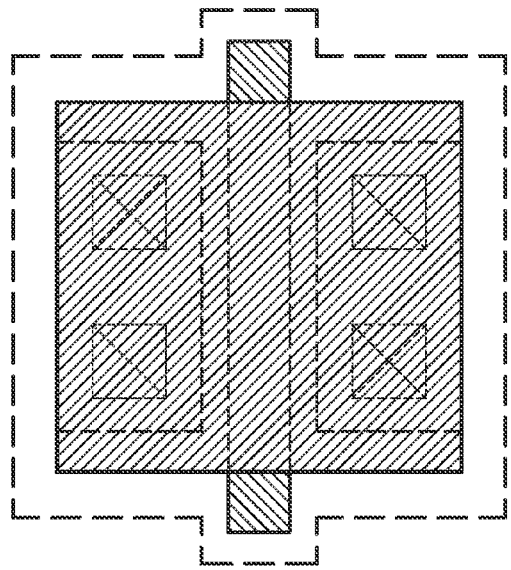
FIG. 4A illustrates an example of a draft device layout.

For example, a user may first generate a draft device layout, as shown in FIG. 4A, by using the device generator. If the user wants to apply optical proximity correction (OPC) to the draft device layout, a script may be written which may be expressed in pseudo code as follows:

```
get contact layer from draft device layout
    iterate all shapes on contact layer in the draft device layout {
        for each convex vertex on returned shape {
            create an OPC rectangle into draft device layout with a center
            on the
        }
    }
```

Figure 4B:
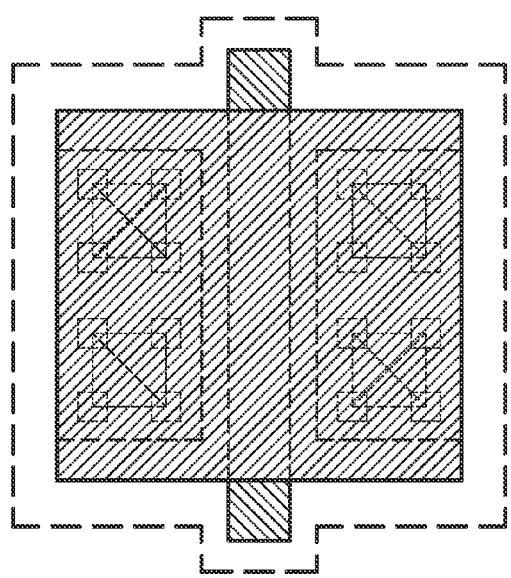
FIG. 4B illustrates an example of an updated device layout corresponding to the draft device layout in FIG. 4A after a script is executed.

After applying the script, the draft device layout is modified and the result is shown in FIG. 4B, wherein an OPC rectangle is created for each convex vertex on the returned shape.

Figure 5A:
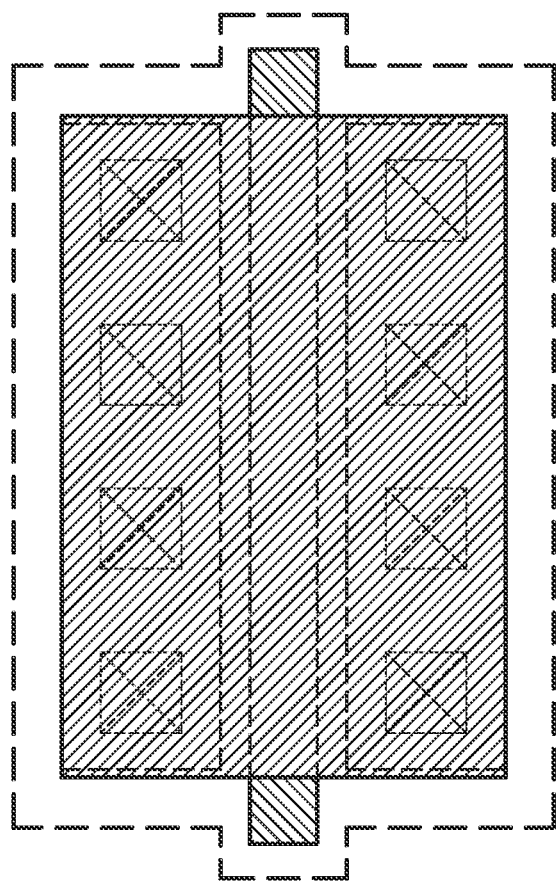
FIG. 5A illustrates another example of a draft device layout.
Figure 5B:
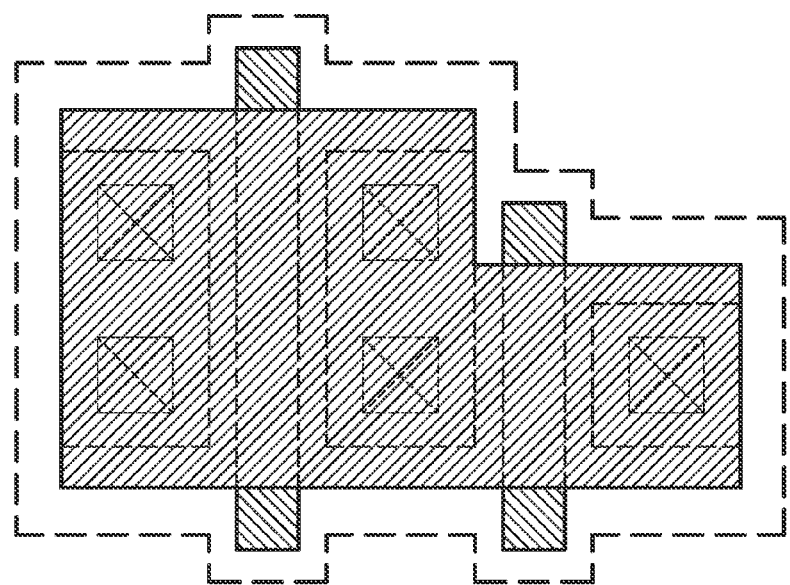
FIG. 5B illustrates an example of a re-generated draft device layout corresponding to the draft device layout in FIG. 5A after some parameter values are modified and the device layout generator is called to re-generate.
Figure 5C:
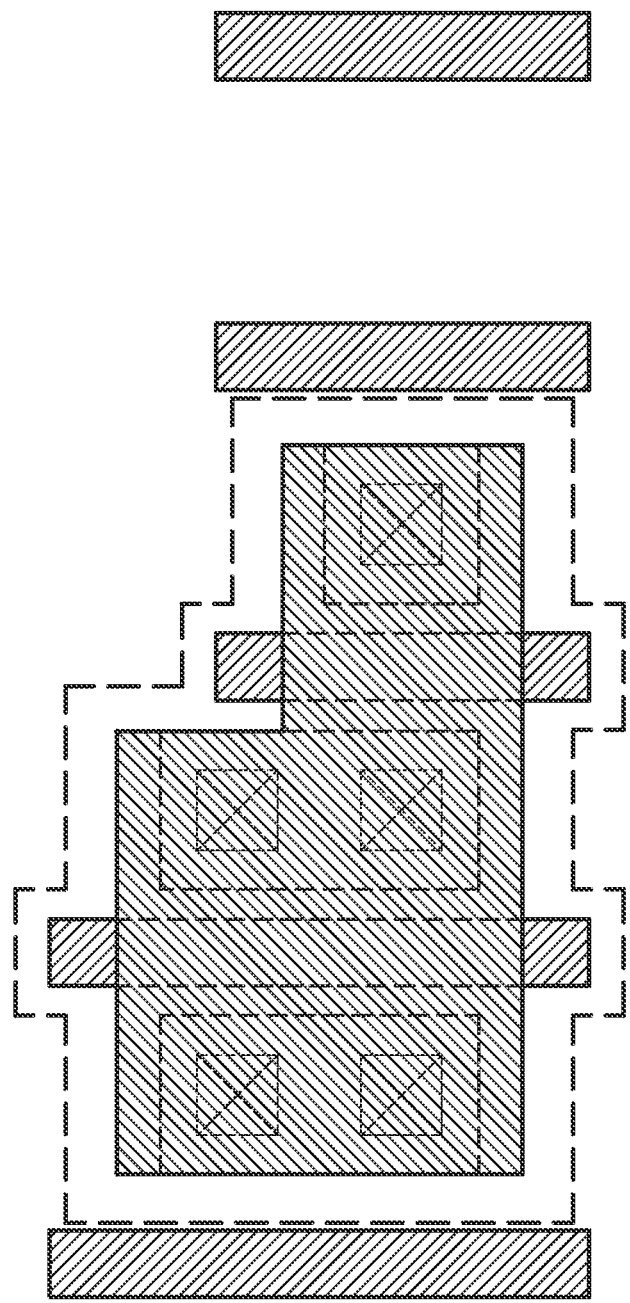
FIG. 5C illustrates an example of a further updated device layout resulted from continued execution of the script after the re-generation of a new draft device layout illustrated in FIG. 5B.

For another example, when a user wants to check and enforce the maximum gate width rule and the dummy poly rule in the draft device layout of FIG. 5A generated by the device generator, a script for maximum gate width rule and dummy poly rule can be executed. First, the draft device layout is checked, and parameters may be changed by the script using the maximum gate width rule. Assume that the gate width in FIG. 5A violates the maximum gate width rule. The script may decide to fold the transistor in FIG. 5A to two smaller transistors, one having a maximum gate width and the other having a gate width for the remaining part. The device generator is then called to re-generate a new draft device layout based on the new parameter values. The result is shown in FIG. 5B. After re-generation, the new draft device layout can be further checked for the dummy poly rule. After querying the shapes in FIG. 5B, the script may decide to add one dummy poly on the left side and two dummy polys on the right side, as shown in FIG. 5C.

Therefore, the methods for generating device layouts can automatically generate draft device layouts, and allow execution of scripts for modifying the draft device layouts, thus providing an easy way to generate device layouts and allowing for flexibility of the layout design.

Methods for generating device layouts, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine, such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine, such as a computer, the machine becomes an apparatus for practicing the disclosed methods. When implemented on a general-purpose processor, the program code combines with the processor to provide a unique apparatus that operates analogously to application specific logic circuits.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed:

1. A computer-implemented method for generating a device layout, the computer-implemented method comprising:
   selecting a plurality of design rules using a computer;
   identifying at least one element of the device using the computer, when the computer is invoked to generate the device layout;
   selecting a parameter value associated with the at least one element using the computer;
   generating a first device layout including a first object having a first number of vertices in accordance with the selected plurality of design rules and the selected parameter value using the computer;
   defining a modified parameter value associated with the at least one element in a script using the computer; and
   executing the script to generate a second device layout including a second object having a second number of vertices being different from the first number of vertices using the computer.

2. The method of claim 1 further comprising:
   validating the modified parameter value against the plurality of design rules.

3. The method of claim 1 further comprising:
   executing a plurality of commands so as to include a third object in the second layout not included in the first layout.

4. The method of claim 1 further comprising:
   executing a plurality of commands so as not to include in the second layout a third object included in the first layout.

5. The method of claim 1 further comprising:
   executing a plurality of commands so as to query at least one of the plurality of design rules, or the parameter value, or data associated with the first layout.

6. A device layout generator comprising:
   a device layout generator which when invoked to generate the device layout is adapted to:
   receive selection of a plurality of design rules;
   receive identification of at least one element of the device;
   receive selection of a parameter value associated with the at least one element; and
   generate a first device layout including a first object having a first number of vertices in accordance with the selected plurality of design rules and the selected parameter value; and
   a script generator adapted to generate a script defining a modified parameter value associated with the at least one element, wherein when executed the script causes a second device layout including a second object having a second number of vertices being different from the first number of vertices to be generated.

7. The device layout generator of claim 6 wherein the device layout generator is further adapted to:
   validate the modified parameter value against the plurality of design rules.

8. The device layout generator of claim 6 wherein the script comprises a plurality of commands which when executed cause the device layout generator to:
   include a third object in the second layout not included in the first layout.

9. The device layout generator of claim 6 wherein the script further comprises a plurality of commands which when executed cause the device layout generator:
   not to include in the second layout a third object included in the first layout.

10. The device layout generator of claim 6 wherein the script further comprises a plurality of commands which when executed cause the device layout generator to:
    query at least one of the plurality of design rules, or the parameter value, or data associated with the first layout.

11. A non-transitory computer-readable storage medium comprising instructions which when executed by a computer cause the computer to:
    select a plurality of design rules;
    identify at least one element of the device, when the computer is invoked to generate a first device layout;
    select a parameter value associated with the at least one element;
    generate the first device layout including a first object having a first number of vertices in accordance with the selected plurality of design rules and the selected parameter value;
    define in a script a modified parameter value associated with the at least one element; and
    execute the script to generate a second device layout including a second object having a second number of vertices being different from the first number of vertices.

12. The non-transitory computer-readable storage medium of claim 11 wherein said instructions further cause the computer to:
    validate the modified parameter value against the plurality of design rules.

13. The non-transitory computer-readable storage medium of claim 11 wherein said instructions enable the script to comprise a plurality of commands which when executed cause the computer:

to include a third object in the second layout not included in the first layout.

14. The non-transitory computer-readable storage medium of claim 11 wherein said instructions further enable the script to comprise a plurality of commands which when executed cause the computer:

not to include a third object in the second layout included in the first layout.

15. The non-transitory computer-readable storage medium of claim 11 wherein said instructions further enable the script to comprise a plurality of commands which when executed cause the computer:

query at least one of the plurality of design rules, or the parameter value, or data associated with the first layout.

* * * * *